United States Patent [19]

Ohashi

[11] Patent Number: 5,263,583
[45] Date of Patent: Nov. 23, 1993

[54] TRANSPORTING IC-PACKAGES

[75] Inventor: Yasuhide Ohashi, Suwa, Japan

[73] Assignee: Seiko Epson Corporation, Tokyo, Japan

[21] Appl. No.: 419,654

[22] Filed: Oct. 11, 1989

[30] Foreign Application Priority Data

Oct. 14, 1988 [JP] Japan .................. 63-134376

[51] Int. Cl.⁵ ................................ B65D 85/38
[52] U.S. Cl. ...................... 206/334; 206/328
[58] Field of Search ................ 206/328–334, 206/521; 53/410, 473

[56] References Cited

U.S. PATENT DOCUMENTS

| | | | |
|---|---|---|---|
| 3,435,949 | 4/1969 | Suverkropp | 206/232 |
| 4,266,684 | 5/1981 | Maccise | 220/4 D |
| 4,564,880 | 1/1986 | Christ et al. | 206/334 |
| 4,565,288 | 1/1986 | Walther | 206/334 |
| 4,632,246 | 12/1986 | Brutosky | 206/328 |
| 4,690,274 | 9/1987 | Lue | 206/328 |
| 4,709,297 | 11/1987 | Walther | 206/328 |
| 4,712,675 | 12/1987 | Scholten et al. | 206/332 |
| 4,721,206 | 1/1988 | Vötter | 206/332 |
| 4,866,574 | 9/1989 | Hsiung | 206/328 |

Primary Examiner—Jimmy G. Foster
Attorney, Agent, or Firm—Spensley Horn Jubas & Lubitz

[57] ABSTRACT

A method of transporting PLCC IC packages (3) having J-shaped bend lead pins utilizing containers (1) for transport, in which the IC packages (3) are mounted upside down such that the lead pins cannot be moved to collide against anything within the container during transport. The method thus ensures that the leads of the IC packages are not deformed and loss of the flatness of the leads can be prevented during transport.

14 Claims, 2 Drawing Sheets

TRANSPORTING IC-PACKAGES

BACKGROUND OF THE INVENTION

1. Field of the Invention

The present invention relates to a container structure for IC (integrated circuit) packages and a method of transporting IC packages having J-shaped bend lead pins, and particularly a method of transporting so called "PLCC" IC packages having lead pins on four sides thereof in such a manner that the lead pins of the packages can be protected from damage due to shocks during transport.

2. Prior Art

Hitherto, tube-shaped containers such as the container 6 shown in FIG. 5 have been used to transport PLCC IC packages. Tube-shaped container 6 has an opening 201 and is provided with a chamfered surface 202 provided for indicating the position or direction of the PLCCs stored in the container. FIG. 6 is a sectional view of such a container in which a PLCC 3 has been inserted. PLCCs 3 are inserted into the container 6 via the opening 201, with the lead pins directed downward.

One problem presented by this known container is that the lead pins of the PLCCs can touch the container when the PLCCs are inserted into the container and further the lead pins of one PLCC can touch the lead pins of adjacent PLCCs after they have been stored in the container. Thus, shocks to the container may cause the lead pins of the IC packages to collide against the container walls or against the lead pins of the neighboring IC packages during transport, resulting in deformation of the lead pins and therefore in loss of flatness thereof.

SUMMARY OF THE INVENTION

It is therefore an object of the invention to provide a container for PLCCs and a method of transporting PLCCs without deforming the lead pins thereof.

A container for IC packages according to the present invention is characterized by that IC packages are stored upside down therein in such a manner that the leads of a stored IC package can never be substantially contacted by the container itself or by an IC package stored adjacent thereto.

Further, the present invention provides a method of transporting PLCCs, characterized in that the IC packages are stored upside down in the container and that the IC packages are transported so that the leads thereof can never be substantially contacted by the container itself and by an IC package stored adjacent thereto.

BRIEF DESCRIPTION OF THE DRAWINGS

The invention will be described, by way of example, with reference to the accompanying drawings, in which.

DESCRIPTION OF THE PREFERRED EMBODIMENTS

Figure 1A:
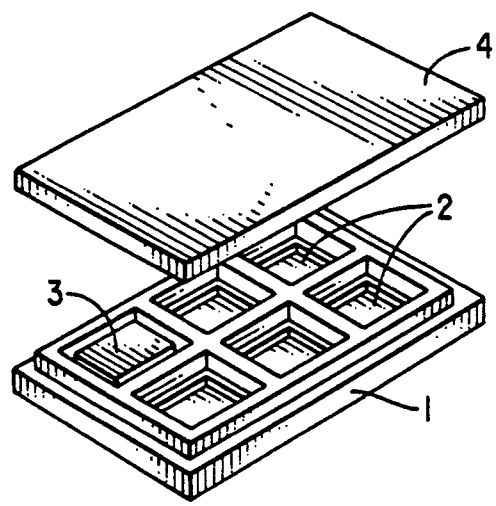
FIGS. 1(a), 1(b) and 1(c) are perspective views showing an embodiment of the present invention.
Figure 1B:
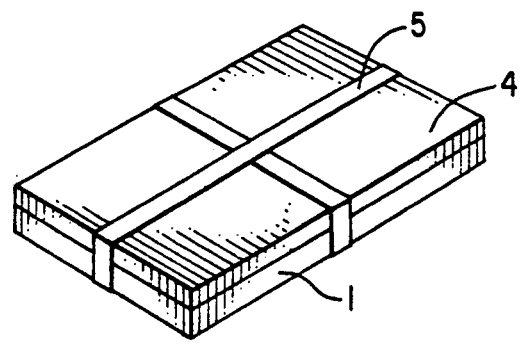
Figure 1C:
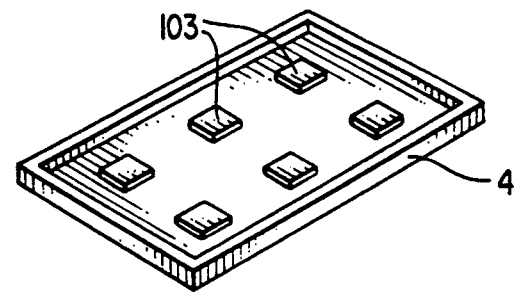

FIGS. 1(a), 1(b) and 1(c) are perspective views showing an embodiment of the invention, composed of a container body 1 and a lid 4. Body 1 is provided with pockets 2 for storage of PLCCs 3. A band 5 is provided for fixing container body 1 and lid 4 together. Specifically, FIG. 1(a) shows the container body before it is closed by lid 4, and FIG. 1(b) shows them in a position in which they are to be transported. FIG. 1(c) shows the underside of the lid 4, 103 being projections for preventing the lead pins of a PLCC 3 from touching lid 4.

Figure 2:
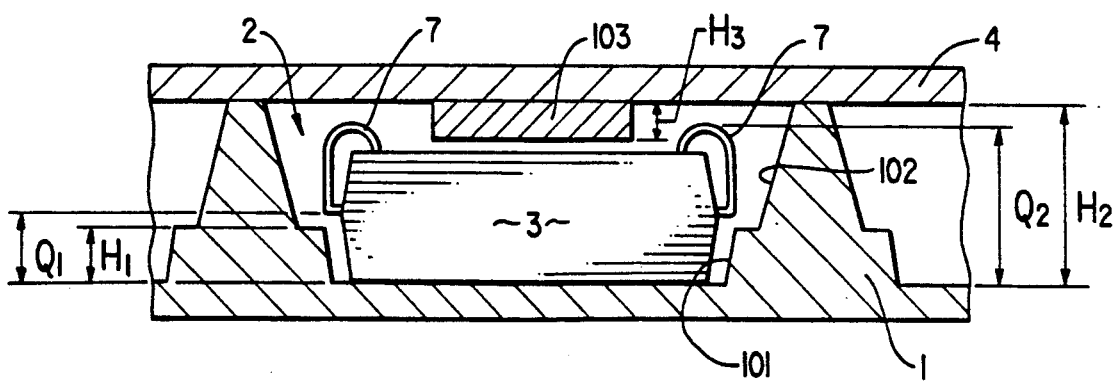
FIG. 2 is a sectional view showing a principal part of a container according to the invention.

FIG. 2 is a sectional view showing a principal part of the container of FIG. 1, in which 101 designates an oblique surface for positioning a PLCC 3 in a storage pocket 2, and 102 designates another oblique surface for protection of the lead pins 7 of PLCC 3. Surfaces 101 and 102 are provided on projections which extend upwardly to the underside of lid 4 and which extend between opposed sides of a body 1 to define the individual pockets.

The vertical height $H_1$ of each oblique surface 101 is smaller than the vertical distance $Q_1$ from the package's (inverted) top face to the top edge of lead pins 7 projecting from package 3 ($H_1 < Q_1$) Further, the oblique surface 102 is in a position recessed from the associated oblique surface 101 so that lead pins 7 of PLCC 3 will not be brought into contact with any surface within the container and will thus be protected even if PLCC 3 should shift horizontally within storage pocket 2.

On the other hand, the depth $H_2$ of the storage pocket 2 is greater than the overall package height $Q_2$ ($H_2 > Q_2$). Each projection 103 has a height $H_3$ which is sufficiently large to ensure that the free ends of lead pins 7 will not touch lid 4 even if the PLCC 3 is moved vertically, i.e., if the container is turned upside down.

To completely protect lead pins 7, the difference between $H_1$ and $Q_1$ should be equal to or greater than 0.5 mm, and the difference between $H_2$ and $Q_2$ should be equal to or greater than 1 mm. The dimensions of the pocket 2 and $H_3$ should be determined such that PLCC 3 can move within storage pocket 2 to an extent of about 0.5 mm horizontally and to an extent of about 0.2 mm vertically. Further, there should be provided a horizontal spacing of greater than 2 mm between the edges of projection 103 and lead pins 7.

Figure 3:
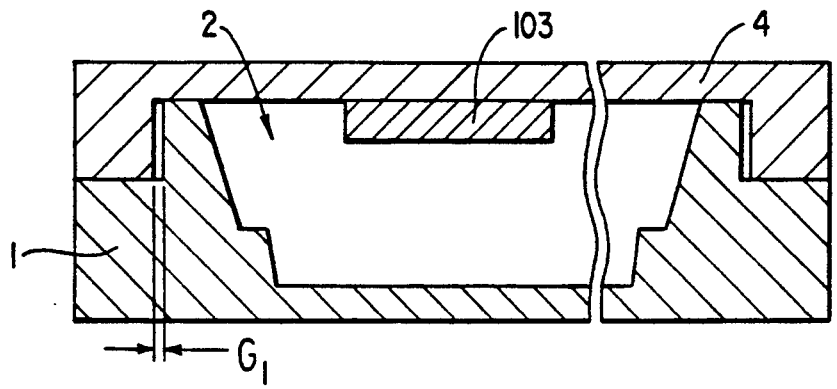
FIG. 3 is a sectional view showing the coupled lid and body of the container of FIG. 2.

FIG. 3 shows a principal part of the container 1 and lid 4 coupled together. The gap $G_1$ existing when the container 1 and the lid 4 are coupled together, should be within a range of 0.5 mm or less in order to ensure that horizontal movement of the lid 4 cannot cause a projection 103 to touch the lead pins 7.

The materials of the container 1 and lid 4, including projections 103, must be selected so that a dimensional precision of at least ±0.3 mm can be ensured, in order that the above-mentioned various dimensional requirements can be met. Further, in view of weight requirements, costs, and electrostatic breakdown of the IC packages to be stored in the container, the container materials should be industrial plastics treated against electrostatic breakdown. Container 1 and lid 4, including projections 103, may all be made of the same material.

Figure 4:
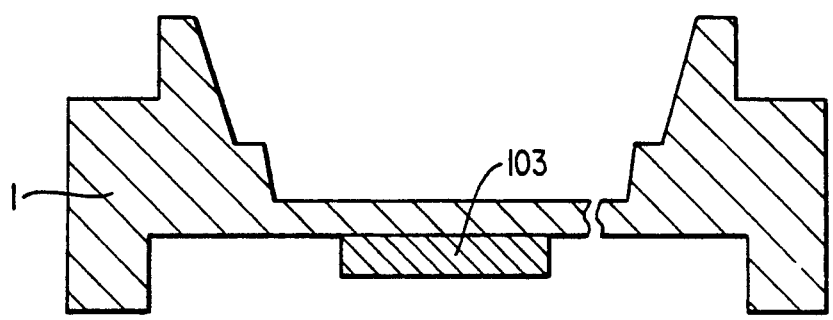
FIG. 4 is a sectional view showing a principal part of another embodiment of a container according to the invention.
Figure 5:
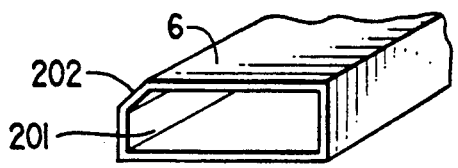
FIG. 5 is a perspective view of a container in accordance with the prior art.
Figure 6:
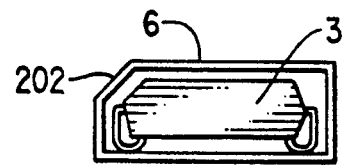
FIG. 6 is a sectional view of the prior art container of FIG. 5.

FIG. 4 is a cross section of a principal part of another embodiment of the present invention, which comprises a container 1 whose bottom can serve as a lid for an underlying container. No separate lid is therefore needed. Stacking of such containers will automatically close each container and the topmost container of a stack will not contain PLCCs and will simply serve as a lid. Many PLCCs can be transported simultaneously by the use of such containers stacked up on one another.

Figure 7A:
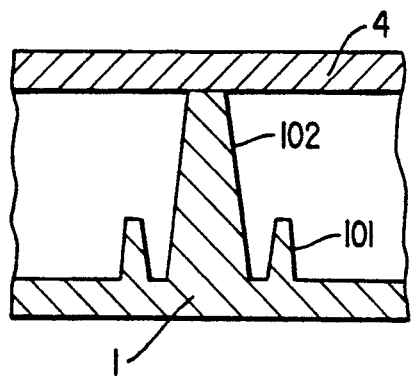
FIGS. 7(a) and 7(b) are sectional views of a part of other embodiments according to the present invention.
Figure 7B:
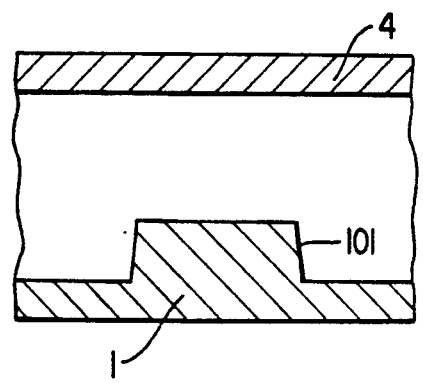

FIGS. 7(a) and 7(b) are sectional views of the part of other forms for the off projections provided in container body 1. FIG. 7(a) shows a structure in which surfaces 101 are on projection parts separated from that providing surfaces 102. FIG. 7(b) shows a structure in which there is no surface 102.

The transport method according to the invention, which utilizes a container in which PLCCs are stored upside down and which thus enable easy protection of the lead pins of the PLCCs, has significant advantages in that the lead pins of the PLCCs stored in the containers can be protected from being deformed by shocks during transport, whereby deformation of the lead pins cannot occur.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A container for IC packages having J-shaped bend lead pins provided thereon, wherein each package has a bottom surface, a top surface and two opposed side surfaces extending between the top and bottom surfaces, and the lead pins are located adjacent the side surfaces, project a first given distance from the bottom surface in the direction away from the top surface, project toward the top surface so as to be spaced by a second given distance from the top surface, and project away from side surfaces by a third given distance, and said container comprises: a body member having a plurality of compartments each for storing a respective package in an upside down position, each compartment having a bottom for supporting the top surface of its respective package; a lid member for engaging said body member in order to close said container; and means for preventing the lead pins of stored IC packages from contacting said container itself or adjacent IC packages stored in said container, said means for preventing comprising a plurality of projections carried by said lid member and each associated with a respective compartment, and each disposed to be in facing relation to the bottom surface of a package in the respective compartment, each said projection having a height which is greater than the first given distance for preventing the lead pins from contacting said lid member.

2. A container as defined in claim 1 wherein each said projection is dimensioned and positioned to be maintained out of contact with a package stored in its associated compartment when the container is oriented such that said lid member is above said body member.

3. A container as defined in claim 2 wherein said body member comprises a plurality of compartment wall elements bounding said compartments for retaining each package within its associated compartment.

4. A container as defined in claim 3 wherein said wall elements are configured to prevent the lead pins of packages stored in said compartments from contacting said wall elements.

5. A container as defined in claim 4 wherein each said wall element comprises a portion which bounds a respective compartment and projects upwardly from said compartment bottom to a height which is less than the second given distance.

6. A container as defined in claim 5 wherein said compartments are separated from one another, in at least one direction, by a distance which is greater than twice the third given distance.

7. A container as defined in claim 1 further comprising a second body member forming a unit with said lid member, said second body member having a second plurality of compartments each for storing a respective package above packages stored in said compartments of said first-recited body member, each compartment of said second body member having a bottom for supporting the top surface of a respective package.

8. A container as defined in claim 7 wherein said second body member is integral with said lid member.

9. A container as defined in claim 1 wherein said body member and said lid member are provided with cooperating surfaces which are located to prevent said lid member from shifting relative to said body member, parallel to said compartment bottoms, by an amount which would bring any one of said projections into contact with the lead pins of a respective package.

10. A container as claimed in claim 1 wherein the body of each IC package has a thickness measured from the top surface to the bottom surface and wherein:

$H_2 - Q_2 \geq 1.0$ mm.;

$Q_2$ is defined as the sum of the thickness of the body of an IC package and the first distance; and
$H_2$ is defined as the distance between said substantially planer surface of said container body and said lid upon said lid covering said compartments.

11. A container for containing plural IC packages of the type having lead pins extending from a body, said container comprising:
a container body having a plurality of compartments, each compartment of a size for receiving no more than one IC package; and
means for preventing the lead pins of each IC package from contacting said container body upon the IC packages being received by said compartments;
a lid configured to cover said plurality of compartments;
wherein said means for preventing further comprises a plurality of second projections extending from said lid into a corresponding plurality of compartments upon said lid covering said plurality of compartments, each second projection having a surface arranged to contact the body without contacting the pins of an IC package upon the IC package being received by said compartment into which said projection extends.

12. A container for containing plural IC packages of the type having lead pins extending from a body, said container comprising:

a container body having a plurality of compartments, each compartment of a size for receiving no more than one IC package; and means for preventing the lead pins of each IC package from contacting said container body upon the IC packages being received by said compartments;

wherein the body of each IC package has at least four side surfaces, a top surface and a bottom surface, wherein the pins of each IC package extend from at least two side surfaces of the IC package body and from a location of the body which is a first distance from the top surface of the body, and wherein;

said container body further having a substantially planer surface from which said first projections extend, said substantially planer surface for contacting the top surface of the body of each IC package upon the IC packages being received by one of said compartments; and said at least one surface of said first projections extends from said substantially planer surface of said container by a distance which is less than the first distance;

wherein the pins of each IC package extend toward the bottom surface of the body of the IC package and further extend a second distance from the bottom surface of the body, said container further comprising:

a lid configured to cover said plurality of compartments;

wherein said means for preventing further comprises a plurality of second projections extending from said lid into a corresponding plurality of compartments upon said lid covering said plurality of compartments, each second projection having a surface arranged to contact the body without contacting the pins of an IC package upon the IC package being received by said compartment into which said projection extends;

and wherein said container further comprises means for maintaining said lid a third distance from the bottom surface of each ic package upon the ic packages being received by said compartments, the third distance being greater than the second distance.

13. A container as claimed in claim 12, wherein said second projections extend from said lid by a distance not greater than the third distance.

14. A container as claimed in claim 12, wherein the body of each IC package has a thickness measured from the top surface to the bottom surface and wherein:

$H_2 \geq Q_2 - 1.0$ mm.;

$Q_2$ is defined as the sum of the thickness of the body of an IC package and the second distance; and $H_2$ is defined as the distance between said substantially planer surface of said container body and said lid upon said lid covering said compartments.

* * * * *